United States Patent [19]
Harada et al.

[11] Patent Number: 5,468,973
[45] Date of Patent: Nov. 21, 1995

[54] STACKED JOSEPHSON JUNCTION DEVICE COMPOSED OF OXIDE SUPERCONDUCTOR MATERIAL

[75] Inventors: Keizo Harada; Hideo Itozaki, both of Itami, Japan

[73] Assignee: Sumitomo Electric Industries, Ltd., Japan

[21] Appl. No.: 221,276

[22] Filed: Mar. 31, 1994

Related U.S. Application Data

[63] Continuation of Ser. No. 944,809, Sep. 14, 1992, abandoned, which is a continuation of Ser. No. 667,737, Mar. 11, 1991, abandoned.

[30] Foreign Application Priority Data

Mar. 9, 1990 [JP] Japan ................................. 2-58514

[51] Int. Cl.⁶ .................................................. H01L 39/22
[52] U.S. Cl. ........................ 257/33; 257/35; 505/190; 505/238
[58] Field of Search ....................... 357/4, 5; 505/1, 505/126, 190, 238; 257/33, 35

[56] References Cited

U.S. PATENT DOCUMENTS

| | | | |
|---|---|---|---|
| 4,768,069 | 8/1988 | Talvacchio et al. | 357/5 |
| 4,880,771 | 11/1989 | Cava et al. | 505/1 |
| 5,026,682 | 6/1991 | Clark | 357/5 |
| 5,034,359 | 7/1991 | Fukushima et al. | 501/123 |
| 5,034,374 | 7/1991 | Awaji et al. | 357/5 |
| 5,047,390 | 9/1991 | Higashino et al. | 357/5 |
| 5,057,491 | 10/1991 | Housley | 357/5 |
| 5,061,971 | 10/1991 | Takemura | 357/4 |
| 5,106,819 | 4/1992 | Takemura | 257/35 |

FOREIGN PATENT DOCUMENTS

| | | | |
|---|---|---|---|
| 57-159074 | 10/1982 | Japan | 357/5 |
| 1-12585 | 1/1989 | Japan | 257/35 |
| 2-21677 | 1/1990 | Japan | 257/35 |
| 2-248089 | 10/1990 | Japan | 357/4 |

OTHER PUBLICATIONS

Doss "*Engineer's Guide to High–Tc Superconductivity*" John Wiley & Sons New York (Ed.) pp. 102–105 and 111–113 (1989).

Akoh et al "SNS Josephson Junction Consisting of Y–Ba–Cu–O/Au/Nb Thin Films" *Jap J. Appl. Physics* vol. 27 No. 4 Apr. 1988 pp. L519–L521.

Subramanian et al "A New High–Temperature Superconductor: $Bi_2Sr_{3-x}Ca_xCu_2O_{8+y}$," *Science* vol. 239 Feb. 26, 1988 pp 1015–1017.

Face et al "Preparation of Superconducting Thin Films of Bi–Sr–Ca–CuO by Reactive Sputtering" *Appl. Phys Lett* vol. 53 (3) Jul. 18, 1988.

*Primary Examiner*—Sara W. Crane
*Assistant Examiner*—Courtney A. Bowers
*Attorney, Agent, or Firm*—Pennie & Edmonds

[57] ABSTRACT

A stacked Josephson junction device includes a pair of copper oxide superconductor layers and a non-superconductor layer formed between the pair of oxide superconductor layers. The copper oxide superconductor layers are composed of a compound copper oxide having the composition expressed by the general formula:

$$LnBa_2Cu_3O_v$$

(where Ln is Y or rare earth element and $6<v\leq 7$).

The non-superconductor layer is composed of a chemical compound having the composition expressed by the general formula:

$$Bi_2Y_xSr_yCu_zO_w$$

(where x, y, z and w indicate ratio of components
$0\leq x\leq 2$,
$1\leq y\leq 3$,
$1\leq z\leq 3$,
$6\leq w\leq 13$.

11 Claims, 1 Drawing Sheet

STACKED JOSEPHSON JUNCTION DEVICE COMPOSED OF OXIDE SUPERCONDUCTOR MATERIAL

This is a continuation of application Ser. No. 07/944,809, filed Sep. 14, 1992, now abandoned, which is a continuation of application Ser. No. 07/667,737, filed Mar. 11, 1991, now abandoned.

BACKGROUND OF THE INVENTION

1. Field of the Invention

The present invention relates to a Josephson junction device which can be used in a Josephson computer, a mixer, a sensor and others, and more specifically to a stacked Josephson junction device composed of a non-superconductor layer sandwiched between a pair of superconductor layers each formed of an oxide superconductor material.

2. Description of Related Art

A Josephson junction can exist in various structures. Among the various structures, in practice the most preferable structure is a stacked junction realized by a thin non-superconductor layer sandwiched between a pair of superconductors. In general, the Josephson junction is reduced into practice in the form of a Josephson junction device. A stacked Josephson junction device is comprised of a first superconductor thin layer, a non-superconductor thin layer and a second superconductor thin layer stacked in the named order.

In the above mentioned Josephson junction device, each of the superconductor layers can be formed of any superconductor material, for example, metal type superconductor materials, and so-called compound copper oxide superconductor materials. The non-superconductor layer can be formed of a material selected from a group consisting of insulator materials, semiconductor materials and normal conductor materials, depending upon use of a superconducting device.

Lately, in the stacked Josephson junction devices, various attempts have been made which use a copper oxide superconductor material for the superconductor layers and an oxide typified by MgO and $ZrO_2$ for the non-superconductor layer.

In the stacked Josephson junction the thickness of the non-superconductor layer is determined by a property of the non-superconductor layer itself and a coherence length of the superconductor. For example, if the coherence length of the superconductor is short, the thickness of the non-superconductor layer must be made small. In general, copper oxide superconductor materials have a very short coherence length (several angstroms in a c-axis direction and several tens of angstroms in a direction perpendicular to the c-axis). Therefore, if the non-superconductor layer is formed of an insulator material, the thickness of the non-superconductor material layer must be very thin, about 50 Å at maximum. Even in the case that the non-superconductor layer is formed of a normal conductor material, the thickness of the non-superconductor material layer must be very thin.

In the conventional stacker Josephson junction having each superconductor layer formed of the copper oxide superconductor material, however, the non-superconductor layer is not uniform, and therefore, it has been difficult to obtain an excellent junction. The reason for this is considered to be that when a thin layer of the oxide such as MgO or $ZrO_2$ used for forming the non-superconductor layer is deposited on the copper oxide superconductor, the oxide grows in the form of islands.

The non-superconductor layer grown the form of islands has pin holes and different in thickness from one location to another, which results in a significant adverse effect to the junction.

SUMMARY OF THE INVENTION

Accordingly, it is an object of the present invention to provide a stacked Josephson junction device having superconductor layers each composed of an copper oxide superconductor material, which has overcome the above mentioned defects in the prior art and which has an excellent junction.

The above and other objects of the present invention are achieved in accordance with the present invention by a stacked Josephson junction device including a pair of copper oxide superconductor layers and a non-superconductor layer formed between the pair of copper oxide superconductor layers, the copper oxide superconductor layers including a compound copper oxide having the composition expressed by the general formula:

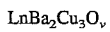

$LnBa_2Cu_3O_v$, (where Ln is Y or rare earth element and $6 < v \leq 7$) and the non-superconductor layer including a chemical compound having the composition expressed by the general formula:

$Bi_2Y_xSr_yCu_zO_w$, (where x, y, z and w indicate ratio of components
$0 \leq x \leq 2$,
$1 \leq y \leq 3$,
$1 \leq z \leq 3$,
$6 \leq w \leq 13$.

As seen from the above, the stacked Josephson junction device in accordance with the present invention includes the non-superconductor layer formed of the compound expressed by $Bi_2Y_xSr_yCu_zO_w$, which non-superconductor layer has the following advantages:

(1) It is a two-dimensionally layered material. Therefore, when it is deposited to form a thin layer, it will easily grow in two dimensions, forming no island.

(2) It has a lattice constant very analogous to the copper oxide superconductor expressed by $LnBa_2Cu_3O_v$.

(3) As an electric property, it can be freely brought to any of a normal conductor, a semiconductor or an insulator. Therefore, it is possible to form an SNS(superconductor-normal conductor-superconductor) device, and an SIS(superconductor-insulator-superconductor) device.

The electric property of the $Bi_2Y_xSr_yCu_zO_w$ compound is dependent upon the value of x, y and z: A general inclination is that in the case of x=0, y=2 and z=1, the compound becomes the normal conductor. If "x", "y" and "z" are not equal to the above values, the semiconductor property and the insulator property appears. Particularly, the larger the value of "x" becomes, the more the insulator property is enhanced.

The above mentioned features are very effective in forming the Josephson junction by using the oxide superconductor.

As mentioned above, the stacked Josephson junction device in accordance with the present invention composed of an oxide superconductor material has a construction in which the non-superconductor layer of the above mentioned compound is laid on a first oxide superconductor layer, and a second oxide superconductor layer is laid on the non-superconductor layer of the above mentioned compound. It is difficult to deposit the oxide superconductor unless an appropriate substrate is used. Therefore, the stacked Josephson junction device in accordance with the present invention is formed on a substrate. Preferably, the stacked Josephson junction device in accordance with the present invention is formed on a single crystal substrate, exemplified by MgO(100) and MgO(110),and SrTiO$_3$(100) and SrTiO$_3$(110).

If the stacked Josephson junction device in accordance with the present invention utilizes a superconductor proximity effect, it is preferred that the compound of the non-superconductor layer has a composition exhibiting the normal conductor property or the semiconductor property.

For example, the stacked Josephson junction utilizing the superconductor proximity effect can be formed in the following process: First, an epitaxial thin film of YBCO (YBa$_2$Cu$_3$O$_y$) (001) is deposited on a MgO (100) substrate. Then, the above mentioned non-superconductor compound is deposited on the YBCO thin film so as to form a non-superconductor layer having a thickness of 30 Å to 500 Å and exhibiting the normal conductor property or the semiconductor property. Furthermore, an epitaxial thin film of YBCO (YBa$_2$Cu$_3$O$_y$) (001) is deposited on the thus formed non-superconductor layer. With this, a Josephson junction device having a good characteristics can be obtained. In this process for forming the Josephson junction device, the compound expressed by Bi$_2$Y$_x$Sr$_y$Cu$_z$O$_w$ forming the non-superconductor layer has a tendency of two-dimensional growth, and has a lattice constant consistent with that of YBa$_2$Cu$_3$O$_y$ forming the superconduction layer. Therefore, heteroepitaxy can be easily realized, which is very effective in obtaining uniform device characteristics.

On the other hand, a SIS device having the Josephson junction in accordance with the present invention can be formed in the following process: First, an epitaxial thin film of YBCO (110) is deposited on a SrTiO$_3$ (110) substrate. Then, the above mentioned non-superconductor compound is deposited on the YBCO thin film so as to form a non-superconductor layer having a thickness of 20 Å to 60 Å and exhibiting the insulator property. Furthermore, an epitaxial thin film of YBCO (110) is heteroeptixially grown on the thus formed non-superconductor layer. In this case, since the YBCO superconductor has the coherence length on the order of 30 Å in a direction perpendicular to the c-axis, it is preferred to grow the superconductor layer having the c-axis parallel to the c-axis of the substrate. Namely, YBCO (110) is epitaxially grown. In the case of the device utilizing the proximity effect, the epitaxial grown layer of YBCO (110) can be used.

In the case of forming the Josephson junction device in accordance with the present invention, each thin layer can be formed by various processes including a MBE (molecular beam epitaxy), a reactive evaporation, a sputtering, and a laser beam evaporation.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Embodiment 1

Figure 1:
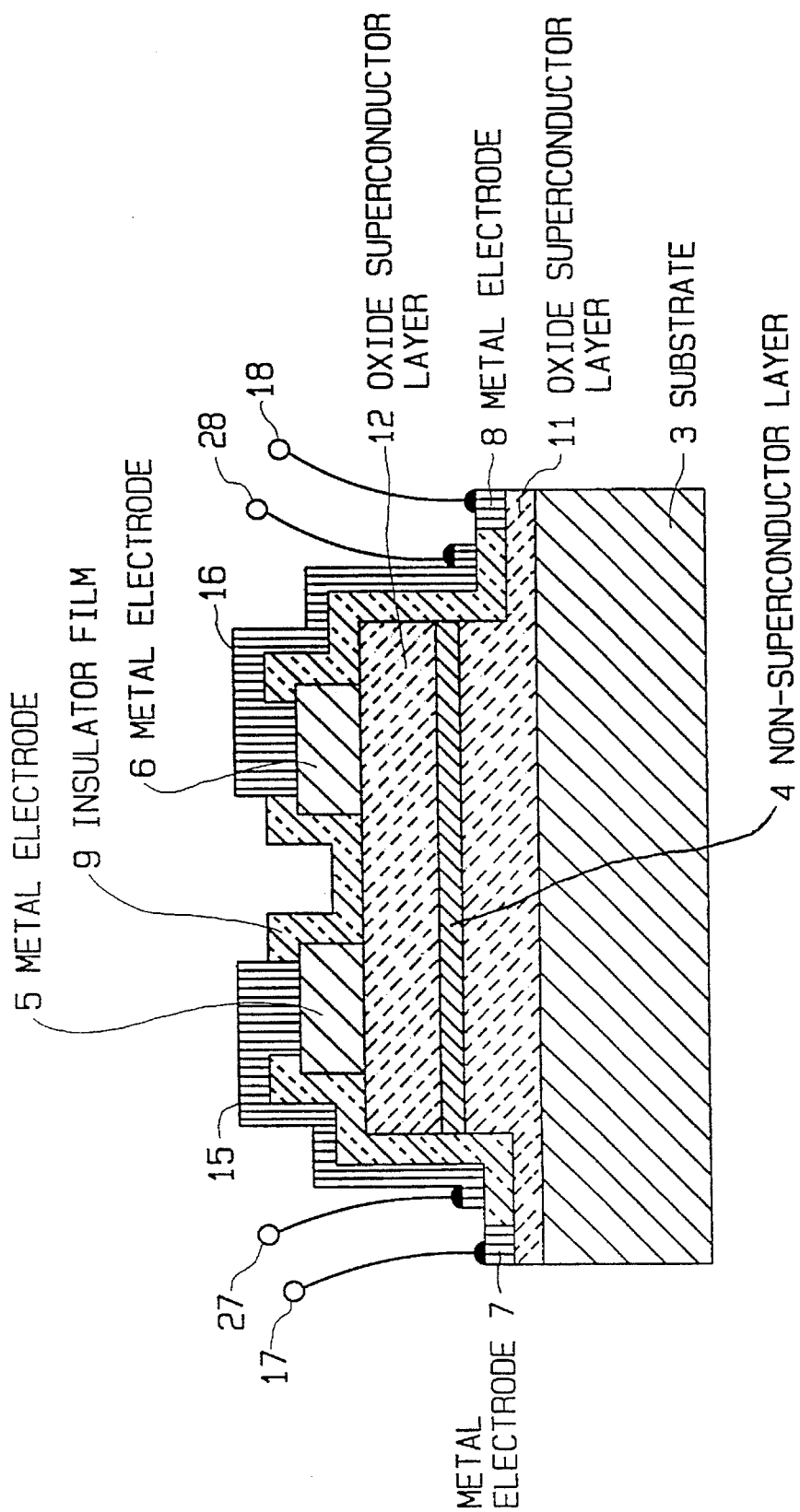
FIG. 1 is a diagrammatic section view illustrating one example of a Josephson junction device in accordance with the present invention.

Referring to FIG. 1, there is shown a diagrammatic section view illustrating one example of a Josephson junction device formed in accordance with the present invention. The shown device includes a first superconductor layer 11 of YBa$_2$Cu$_3$O$_y$ compound oxide superconductor material formed on a MgO (100) single crystal substrate 3, a non-superconductor layer 4 of Bi$_2$Sr$_{1.8}$Cu$_{1.1}$O$_w$ compound formed on a central portion of the first superconductor layer 11, and a second superconductor layer 12 of YBa$_2$Cu$_3$O$_y$ thin film formed on the non-superconductor layer 4 without directly contacting with the first superconductor layer 11. A pair of metal layers 5 and 6 are located on the second superconductor layer 12. In addition, another pair of metal layers 7 and 8 having connecting terminals 17 and 18, respectively, are provided respectively on opposite end portions of the first superconductor layer 11 on which the non-superconductor layer 4 is not formed. The metal layers 5 and 6 excluding an upper surface thereof are covered with an insulating layer 9, and metal layers 15 and 16 are formed on the insulating layer 9 so as to extend from the upper surfaces of the metal layer 5 and 6 and to be connected to connecting terminals 27 and 28 in proximity of the metal layers 7 and 8, respectively.

The superconductor layers and the non-superconductor layer were formed by a sputtering, and have the following thickness:

First superconductor layer YBa$_2$Cu$_3$O$_y$=3000 Å

Non-superconductor layer Bi$_2$Sr$_{1.8}$Cu$_{1.1}$O$_w$=200 Å

Second superconductor layer YBa$_2$Cu$_3$O$_y$=2000 Å

When each of the superconducter layers and the non-superconductor layer was formed, a RHEED pattern was observed. All of the first and second superconductor layers and the non-superconductor layer showed a streak pattern, and therefore, an epitaxial growth of a (001) plane could be confirmed. In addition, both of the first and second superconductor layers exhibited a superconduction critical temperature of 87 K. On the other hand, the non-superconductor layer of Bi$_2$Sr$_{1.8}$Cu$_{1.1}$O$_w$ exhibited a conductor property.

A current-voltage characteristics of the above mentioned Josephson junction device was measured at a temperature of 60 K. When a microwave of 84 GHz is irradiated, a clear Shapiro step was observed, and therefore, it could be ascertained that the device shows the SNS characteristics.

Embodiment 2

Superconductor layers and a non-superconductor layer were formed by using a substrate 3 formed of a SrTiO$_3$ (110) single crystal and by use of a MBE process, so that a Josephson junction device have the same structure as that of the Embodiment 1 is formed. Similarly to the Embodiment 1, the first and second superconductor layers are formed of YBa$_2$Cu$_3$O$_y$, and the non-superconductor layer is formed of a compound expressed by Bi$_2$Y$_1$Sr$_{1.2}$Cu$_{2.8}$O$_w$.

The three layers have the following thickness:

First superconductor layer YBa$_2$Cu$_3$O$_y$=3000 Å

Non-superconductor layer Bi$_2$Y$_1$Sr$_{1.2}$Cu$_{2.8}$O$_w$=40 Å

Second superconductor layer YBa$_2$Cu$_3$O$_y$=2000 Å

When each of the superconductor layers and the non-superconductor layer was formed, a RHEED pattern was observed. In the first and second superconductor layers, epitaxial growth of a (110) plane was confirmed, and in the non-superconductor layer, epitaxial growth of a (001) plane was ascertained. In addition, both of the first and second superconductor layers exhibited a superconduction critical temperature of 88 K.

A current-voltage characteristic of the above mentioned Josephson junction device was measured at a temperature of 40 K. A hysteresis curve showing the SIS junction was obtained.

As seen from the above description, the stacked Josephson junction device in accordance with the present invention is characterized in that the non-superconductor layer includes a chemical compound having the composition expressed by the general formula:

$$Bi_2Y_xSr_yCu_zO_w$$

(where x, y, z and w indicate ratio of components
$0 \leq x \leq 2$,
$1 \leq y \leq 3$,
$1 \leq z \leq 3$,
$6 \leq w \leq 13$.

With this feature, the stacked Josephson junction device in accordance with the present invention has an excellent I-V characteristics in comparison with the conventional ones.

The stacked Josephson junction device in accordance with the present invention can be utilized in a Josephson computer and as a mixer and a sensor.

The invention has thus been shown and described with reference to the specific embodiments. However, it should be noted that the present invention is in no way limited to the details of the illustrated structures but changes and modifications may be made within the scope of the appended claims.

We claim:

1. A stacked Josephson junction device including a first and second high temperature copper oxide superconductor layer and a non-superconductor layer derived from the superconductor formed between the first and second high temperature copper oxide superconductor layers, the first and second high temperature copper oxide superconductor layers having the composition expressed by the general formula:

$$LnBa_2Cu_3O_v$$

where Ln is selected from the group consisting of yttrium and a rare earth element;
and where $6<v\leq7$; and the non-superconductor layer having the composition expressed by the general formula:

$$Bi_2Y_xSr_yCu_zO_w$$

where the values of x, y, z and w are
$0 \leq x \leq 2$,
$1 \leq y \leq 3$,
$1 \leq z \leq 3$, and
$6 \leq w \leq 13$.

2. The stacked Josephson junction device of claim 1 wherein the non-superconductor layer has a composition ratio of x:y:z so that the non-superconductor layer is a normal conductor, and wherein the non-superconductor layer has a thickness of approximately 200 Å°, so that a superconductor-normal conductor-superconductor type Josephson device is formed.

3. The stacked Josephson junction device of claim 2 wherein the value of "x" in the non-superconductor layer is 0.

4. The stacked Josephson junction device of claim 2 wherein the composition ratio of x:y:z in the non-superconductor layer is 0:2:1.

5. The stacked Josephson junction device of claim 2 wherein said composition ratio of x:y:z to promote a normal conductive behavior in the non-superconductor layer is 0:1.8:1.1.

6. The stacked Josephson junction device of claim 1 wherein the non-superconductor layer has a composition ratio of x:y:z so that the non-superconductor layer is an insulator and has a thickness in the range of 20 Å to 60 Å, so that a superconductor-insulator-superconductor type Josephson device is formed.

7. The stacked Josephson junction device of claim 6 wherein the value of "x" in the non-superconductor layer is 1.

8. The stacked Josephson junction device of claim 6 wherein said composition ratio of x:y:z to promote an insulative behavior in the non-superconductor layer is 1:1.2:2.8.

9. The stacked Josephson junction device of claim 1 wherein said first high temperature copper oxide superconductor layer is formed on a single crystal perovskite substrate selected from the group consisting of MgO(100) MgO(110) SrTiO$_3$(100), and SrTiO$_3$(110).

10. A Josephson junction device comprising a first superconductor layer formed of high temperature copper oxide superconductor thin film formed on a substrate, a non-superconductor layer derived from the superconductor formed on a central convex portion of the first superconductor layer, and a second superconductor layer formed of high temperature copper oxide superconductor thin film formed on the non-superconductor layer without directly contacting the first superconductor layer, a first and second metal electrodes located on the second superconductor layer separately from each other, third and second metal electrodes provided respectively on opposite end portions of the first superconductor layer on which the non-superconductor layer is not formed, the high temperature copper oxide superconductor layers including a compound cooper oxide having the composition expressed by the general formula:

$$LnBa_2Cu_3O_v$$

where Ln is selected from the group consisting of yttrium and a rare earth element;
and where $6<v\leq7$; and the non-superconductor layer having the composition expressed by the general formula:

$$Bi_2Y_xSr_yCu_zO_w$$

where the values of x, y, z and w are
$0 \leq x \leq 2$,
$1 \leq y \leq 3$,
$1 \ z \leq 3$, and
$6 \leq w \leq 13$.

11. The stacked Josephson junction device of claim 1 wherein the non-superconductor layer has a composition ratio of x:y:z so that the non-superconductor layer is a semiconductor.

* * * * *